United States Patent [19]
Rogers et al.

[11] Patent Number: 6,080,031
[45] Date of Patent: Jun. 27, 2000

[54] METHODS OF ENCAPSULATING ELECTROLUMINESCENT APPARATUS

[75] Inventors: Stephen P. Rogers, Phoenix; Brian Webb, Chandler, both of Ariz.

[73] Assignee: Motorola, Inc., Schaumburg, Ill.

[21] Appl. No.: 09/145,457

[22] Filed: Sep. 2, 1998

[51] Int. Cl.$^7$ ................................................. H05B 33/10
[52] U.S. Cl. .............................................. 445/25; 445/43
[58] Field of Search ........................ 445/25, 43; 257/704, 257/710; 361/752; 438/25, 26, 121

[56] References Cited

U.S. PATENT DOCUMENTS

| | | | |
|---|---|---|---|
| 5,635,672 | 6/1997 | Kawaura | 257/704 |
| 5,757,126 | 5/1998 | Harvey, III et al. | 313/504 |
| 5,771,562 | 6/1998 | Harvey, III et al. | 313/504 |

*Primary Examiner*—Kenneth J. Ramsey
*Attorney, Agent, or Firm*—Eugene A. Parsons; William E. Koch

[57] ABSTRACT

A method of encapsulating organic electroluminescent (EL) devices including providing an EL device on a substrate and a metallic sheet having a stand-off structure depending therefrom, the stand-off structure bounding a cavity larger than the EL device. The stand-off structure is positioned over the EL device with the EL device nested within the cavity. The metallic sheet is adhesively bonded to the substrate at a perimeter outboard of the stand-off structure to seal the organic electroluminescent device in the cavity. When a plurality of EL devices are manufactured on a single substrate, the metallic sheet is perforated at the perimeter of each device so that excess metal can be separated and the substrate separated to provide individual EL devices.

17 Claims, 3 Drawing Sheets

METHODS OF ENCAPSULATING ELECTROLUMINESCENT APPARATUS

FIELD OF THE INVENTION

This invention relates generally to the field of electroluminescent apparatus and, more particularly, to organic electroluminescent apparatus and improved methods of manufacturing and encapsulating organic electroluminescent apparatus.

BACKGROUND OF THE INVENTION

Electroluminescent (EL) apparatus may be classified as organic or inorganic. Electroluminescent apparatus exhibit high visibility due to inherent self-emission characteristics and provide excellent impact resistance and handling ability. As a result, research, development and practical utilization of EL apparatus as pixels for graphic display, pixels for a television image display and as a light source are currently underway.

Organic EL apparatus normally include a laminate structure having, among other things, a light-emitting layer formed of a fluorescent organic solid and electrode apparatus. This laminate structure is normally formed on a substrate such as glass. This type of organic EL apparatus exhibits light emission characteristics provided when electrons injected into the light-emitting layer are recombined. As a result, organic EL apparatus is actuated by a low voltage and exhibits a level of brightness proportional to the injected electric current. By changing the type of fluorescent organic solids comprising the light-emitting layer, light emission may be obtained through substantially the entire visible light region.

The fluorescent organic solids commonly used to form the light-emitting layer of organic EL apparatus are susceptible to water, oxygen and other environmental elements present in ambient conditions. Furthermore, electrode apparatus formed on the light-emitting layer is also prone to oxidation from exposure to water, oxygen, etc. As a result, conventional organic EL apparatus exhibit a short life as a usable device in atmospheric conditions. To increase the life of organic EL apparatus, electrode apparatus and the light emitting layer must be protected from water, oxygen and other environmental elements.

To increase the life of organic EL apparatus in this regard, various methods and techniques have been devised for encapsulating organic EL apparatus with protective layers of varying compositions. Although exemplary, such methods and techniques are difficult and expensive to implement, require specialized processing equipment or techniques, and/or yield largely nominal results.

Accordingly, it would be highly desirable to provide improved encapsulated organic EL apparatus and improved methods of encapsulating organic EL apparatus.

It is a purpose of the present invention to provide a new and improved method of encapsulating organic EL apparatus that is highly effective for extending operating life.

It is another purpose of the present invention to provide a new and improved method of encapsulating organic EL apparatus that is relatively easy to implement.

It is still another purpose of the present invention to provide a new and improved method of encapsulating organic EL apparatus that is relatively inexpensive.

It is a further purpose of the present invention to provide new and improved encapsulation for organic EL apparatus which prevents exposure to ambient environmental conditions.

SUMMARY OF THE INVENTION

The above problems and others are at least partially solved and the above purposes and others are realized in new and improved organic EL apparatus and improved methods of manufacturing and encapsulating organic EL apparatus. In a specific embodiment, organic EL apparatus is generally comprised of a substantially metallic sheet sealed at a perimeter to bound an organic EL device, and a stand-off, which may also act as a hydroscopic barrier, inboard of the perimeter and cooperating with the substantially metallic sheet to bound the organic EL device in an environmentally controlled cavity. In a particular embodiment, the substantially metallic sheet may be constructed of aluminum, copper or other suitable metal, and the stand-off structure may be comprised of epoxy, polyimide, or silicone materials. The stand-off structure provides or defines an environmentally controlled cavity for the EL apparatus.

During manufacturing, it is generally expedient to provide a plurality of EL devices on a single substrate. To cover the entire substrate with a foil sheet, the sheet is appropriately perforated so as to be able to remove excess foil from between EL devices when the EL devices are separated into individual EL devices.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DETAILED DESCRIPTION OF A PREFERRED EMBODIMENT

The present invention provides, among other things, improved encapsulated organic EL apparatus and improved methods of manufacturing and encapsulating organic EL apparatus. While the present disclosure is directed toward organic EL apparatus in a preferred embodiment, it should be understood that the subject encapsulation process is effective to encapsulate any device where the encapsulation material cannot be in contact with the device being encapsulated, e.g. micro-machined accelerometers, standing acoustic wave (SAW) devices, R. F. devices in which the encapsulation is frequency sensitive, etc. The present invention incorporates a metallic sheet or foil element as an encapsulation cover for organic EL apparatus in addition to a stand-off structure patterned with the sheet to hermetically bound the organic EL apparatus to provide an environmentally controlled cavity.

Figure 1:
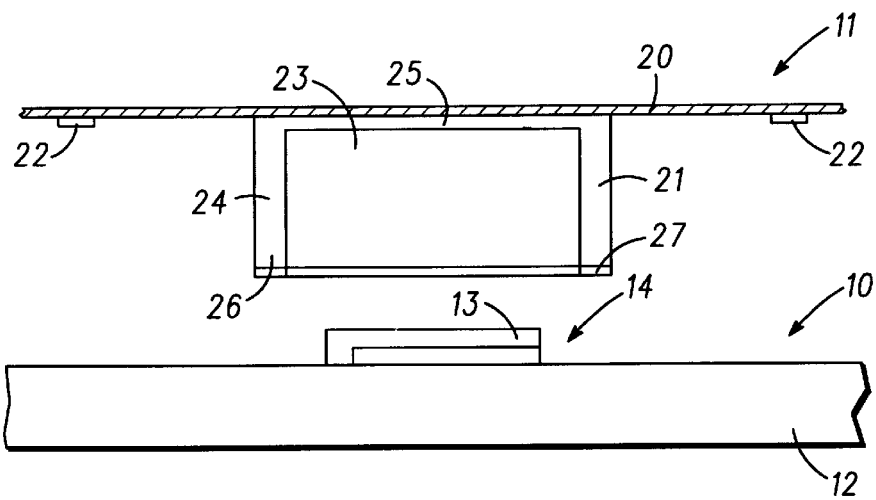
FIG. 1 illustrates a sectional view of organic EL apparatus and a cover shown spaced from organic EL apparatus, in accordance with the present invention.

Turning to FIG. 1, a sectional view is illustrated of an organic EL apparatus 10 and a cover 11 spaced from apparatus 10, in accordance with the present invention. Apparatus 10 includes an EL device or display (generally a two dimensional array of EL devices), hereinafter referred to simply as device 13, carried by or otherwise mounted on a glass substrate 12. In accordance with conventional practice, and although not specifically shown, device 13 is generally comprised of laminate structure having sequentially layered elements including positive electrode apparatus, a light emitting layer or layers provided in the form of a single- or multiple- organic electroluminescent material film or layer and opposing negative electrode apparatus. Consistent with the ensuing discussion, device 13 is generally intended to include a display area or active organic region generally denoted at 14.

The various structural features of apparatus 10 represent conventional constitutions of known organic EL apparatus, additional details of which will not be herein further addressed as they will readily occur to the skilled artisan.

Figure 3:
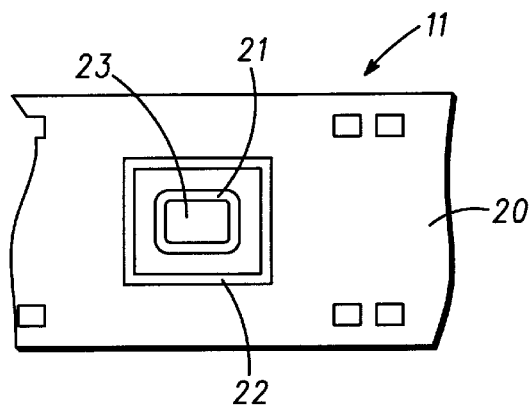
FIG. 3 illustrates a bottom plan view of the cover of FIG. 1.

Cover 11 is generally comprised of a metallic sheet 20 constructed of, for instance, aluminum, copper, oxides of metals, or other metallic sheet or foil-like material. With additional reference to FIG. 3 illustrating a bottom plan view of cover 11, carried by sheet 20 is a barrier or standoff 21 and a sealant 22 provided as a continuous perimeter outboard of and bounding barrier 21. Standoff 21 is formed of epoxy, polyimide, or silicone and may optionally include or be constructed of a substantially hydroscopic material. Sealant 22 is provided as a conventional epoxy film or other suitable adhesive film. Stand-off 21 and sheet 20 cooperate together to bound a cavity 23. In the specific example presently set forth in FIG. 1, stand-off 21 is generally defined by a continuous sidewall 24 having a closed end 25 coupled with sheet 20 and depending therefrom and terminating with a continuous edge or rim 26.

Figure 2:
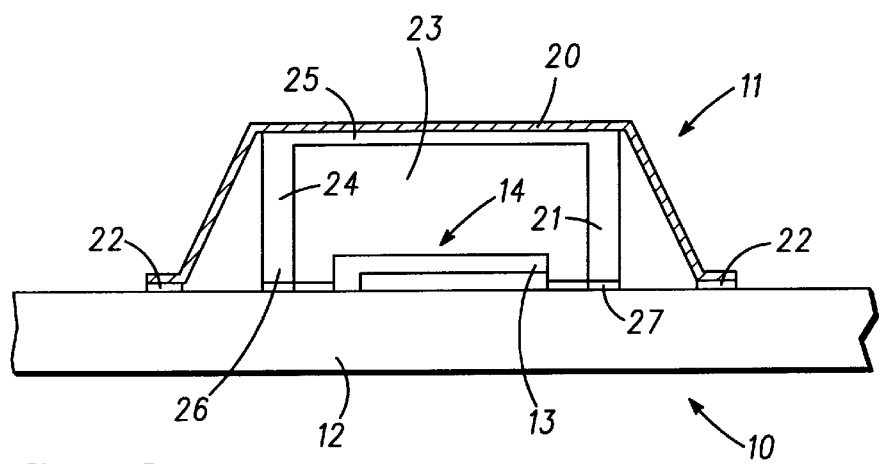
FIG. 2 illustrates a sectional view of organic EL apparatus of FIG. 1 as it would appear encapsulated with the cover.

Like conventional organic EL apparatus, device 13 of apparatus 10 will degrade rapidly under normal ambient conditions due to exposure to, for instance, moisture and oxygen. To protect or otherwise shield device 13 from normal ambient conditions, cover 11 may be fixed with apparatus 10 for packaging, bounding or otherwise containing device 13 in an environmentally controlled environment defined generally by cavity 23. In this regard, FIG. 2 illustrates a sectional view of apparatus 10 as it appears encapsulated with cover 11. So encapsulated or packaged, sheet 20 is shown sealed with apparatus 10, and more particularly to substrate 12, by sealant 22. Sealant 22 generally defines a perimeter seal of sheet 20 bounding device 13, with stand-off 21 inboard of the perimeter containing or otherwise bounding device 13 in cavity 23. As shown in FIGS. 1 and 2, edge 26 of stand-off 21 may be provided with a sealant 27 for sealingly engaging apparatus 10 outboard of device 13 for further sealing device 13 in cavity 23. Like sealant 22, sealant 27 may be provided as a conventional epoxy layer or other suitable adhesive.

With sheet 20 and stand-off 21 each sealed to encapsulate device 13 as illustrated in FIG. 2, sheet 20 and stand-off 21 define protective layers substantially impermeable to moisture, oxygen and other potential ambient environmental conditions that may otherwise result in the degradation of device 13 from exposure. In this regard, cavity 23 defines a controlled environment within which device 13 may operate. Cover 11 is extremely light weight and exhibits a low profile on the order of 0.005 inches to 0.010 inches in height. Furthermore, although stand-off 21 acts as a secondary barrier, or getter against oxygen and water, sheet 20 acts as a primary barrier against oxygen and water in its elemental form whether aluminum, copper, oxides of metals, or other selected metallic material suitable for use consistent with the teachings herein set forth.

Figure 4:
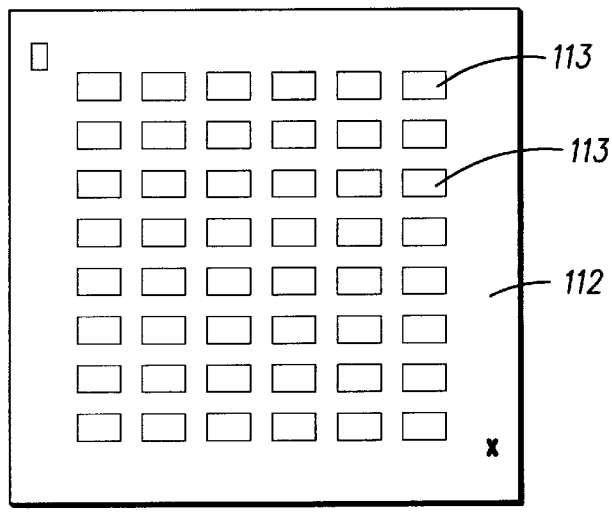
FIG. 4 is a view in top plan of a substrate with a plurality of EL devices positioned on a common substrate.
Figure 5:
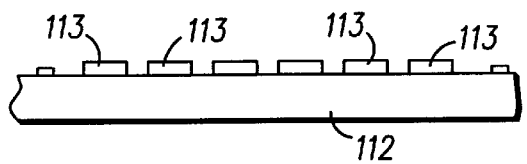
FIG. 5 is a side view of the structure illustrated in FIG. 4.

Referring specifically to FIGS. 4 and 5, a two dimensional array of EL devices 113 formed on a common substrate 112 are illustrated in top plan and side views, respectively, as they would normally appear in a conventional manufacturing process. In a preferred embodiment, each of the individual devices is a complete two dimensional array of pixels, or an electroluminescent display. Typically, each EL device 113 has an area in a range of 1 $\mu$m to 10 mm, for single pixel devices, and 10–2500 square millimeters, preferably 20 mm×50 mm, for display devices (i.e. arrays of pixels). Further, substrate 112, in this embodiment has an area in a range of 100 to 8250 square millimeters, preferably 200 mm×200 mm, with the specific example illustrated being 480 mm on a side.

Figure 6:
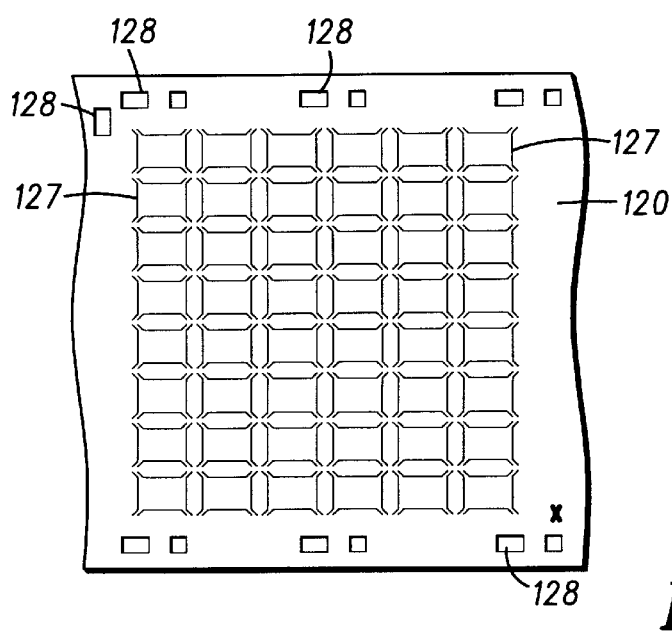
FIG. 6 is a view in top plan of a metallic sheet with a perforation pattern defining covers for the plurality of devices illustrated in FIG. 4 to allow singulation of individually encapsulated EL devices in accordance with the present invention.

A foil sheet 120, shown in FIG. 6, is provided which has a plurality of stand-off structures 121 affixed thereto. Foil sheet 120 also has a perimeter sealant 122 surrounding each of the stand-off structures 121, as described in conjunction with FIGS. 1 through 3 above. In addition, foil sheet 120 has perforations 127 pre-formed therein and positioned to circumscribe each of the perimeter sealants 122 surrounding each of the stand-off structures 121.

Figure 7:
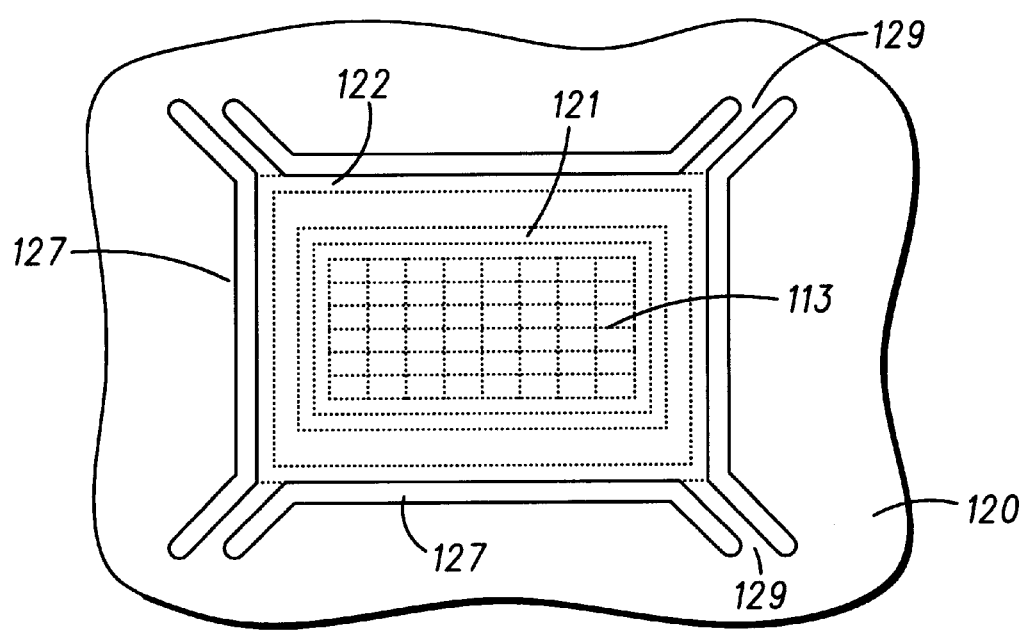
FIG. 7 is a greatly enlarged view of an individual perforation pattern from the metallic sheet of FIG. 6.

Referring specifically to FIG. 7, a portion of foil sheet 120 associated with a greatly enlarged single EL device 113 with associated stand-off structure 121, perimeter sealant 122, and perforations 127 are illustrated in top plan. To provide a comprehensive understanding of the positions of the various components, the single EL device 113, associated stand-off structure 121, and perimeter sealant 122 are illustrated in broken lines, since they would not be visible through the portion of foil sheet 120. In FIG. 7 foil sheet 120 is already pressed into position so that stand-off structure 121, and perimeter sealant 122 are engaged with the surface of substrate 112 (see FIG. 2).

Generally, foil sheet 120 has a thickness in a range of 25.4 $\mu$m to 254 $\mu$m and preferably is approximately 50.8 $\mu$m thick. Also, foil sheet 120, for purposes of manufacturing is provided in a continuous roll of a convenient metal such as copper, aluminum, oxides of metal, etc. Roll indexing holes 128 (see FIG. 6), positioned adjacent the edges of foil sheet 120, are provided as a means of moving foil sheet 120 along the fabrication process, positioning foil sheet 120 for patterning, and alignment. The roll format provides a means for handling and the strength required in the handling.

A first process step in preparing and using a roll of foil is a stamping process to produce the perforation (127) pattern and alignment marks 128. The design of perforations 127 allows for the multiplicity of foil covers for EL device encapsulation to remain as a sheet format by connecting tabs 129 (see FIG. 7) at the corners of each individual cover.

A second process step is to index foil sheet 120 for pressing to flatten the sheet.

A third indexing occurs for a process step of screen printing or offset printing a stand-off sealant positioned to sealingly engage the edges of stand-off structure 121. In this preferred embodiment the stand-off sealant is a polyimide and the patterning process is preferably a two step process designed to provide a taller stand-off feature and/or to provide an insulating layer in the area of the cavity surrounding the EL device above the EL device. The height of the stand-off sealant is on the order of the thickness of the metal foil or thinner but not less than 1 $\mu$m. Generally, the relative heights of the stand-off sealant, perimeter sealant 122 and stand-off structure 121 should be such that the final height of stand-off structure 121 is greater than the thickness of perimeter sealant 122 and preferably approximately 50% greater. An insulating layer pattern (not shown), if present, should not be connected to the stand-off sealant pattern so that moisture accumulation in one pattern can not migrate to the other pattern via the foil sheet interface. The stand-off sealant and insulating layer, if present, are cured by indexing the foil sheet 120 into a furnace or convection oven, capable of providing up to 400° C. temperature, and purged with either a dry inert gas, such as nitrogen or argon, or a dry slightly reducing gas ambient, such as 5% $H_2$/Ar or 5% $H_2$/$N_2$ (generally known as forming gas). These cure conditions lead to a fully cured, dry polyimide, and the reducing conditions reduce any metal oxides present on foil sheet 120 to elemental metal capable of acting as an oxygen getter.

A next process step indexes foil sheet 120 for the patterning of perimeter seals 122 by screen printing, offset printing, inkjet, or pressure dispensing techniques. This particular process may also be performed on substrate 112 by offset, inkjet, or pressure dispensing printing only, if more convenient in a specific manufacturing procedure. Here it should be noted that all processes and handling subsequent to the polyimide curing need to be carried out in dry inert ambients due to the hydroscopic nature of the cured polyimide. The width of perimeter seal 122 is a minimum of 1 mm and preferrable it is 2 mm with a maximum thickness of 127 mm. In the selection of the material used for perimeter sealant 122 (and foil thickness), the adhesion strength to foil sheet 120 and to substrate 112 should be greater than a tear force required at connecting tabs 129 of foil sheet 120. This tear force will vary depending on the type of metal foil, foil thickness, and design of the perforations. The preferred design of the perforations is such that connecting tabs 129 are narrow and include the least amount of metal, generally in a range of 5% to 50% and preferably 5% to 10% greater than the metal foil thickness.

In a following step of the process, foil sheet 120 is indexed into the correct position overlying substrate 112, the various components are pressed into engagement, as described previously, and the stand-off sealant and perimeter sealant 122 are cured to completely seal each of the EL devices 113. After curing stand-off sealant and perimeter sealant 122 during the encapsulation step, foil sheet 120 is peeled back from substrate 112, separating foil sheet 120 at tabs 129 by tearing, lasing, etc., and leaving a portion of foil sheet 120 attached as the encapsulation cover over each EL device 113. The encapsulated plurality of EL devices 113 can then be separated into individual EL devices by scribing substrate 112 in a conventional manner and separating the devices along the scribe lines.

In summary, the present invention proposes a metallic sheet or foil element as an encapsulation cover for organic EL apparatus in addition to a stand-off structure, which may include a hydroscopic barrier, patterned with the sheet to hermetically bound at least a display area of organic EL apparatus in an environmentally controlled cavity. The substantially metallic sheet and the stand-off structure or hydroscopic barrier cooperate as a dual barrier protective cover for providing a mechanism substantially impermeable to water and oxygen, thus providing exemplary hermetic packaging.

Furthermore, the various methods of the present invention may be incorporated into an array packaging scheme for the encapsulation or manufacture of multiple EL apparatus. To this end, a plurality of EL devices is provided on one or more glass substrates and an array of encapsulation covers carried by one or more metallic sheets. In this regard, a suitable array frame/press heater is provided for pressing the metallic sheet for facilitating substantially simultaneous encapsulation of each of the EL devices with an opposing one of the plurality of encapsulation covers.

The present invention has been described above with reference to a preferred embodiment. However, those skilled in the art will recognize that changes and modifications may be made in the described embodiments without departing from the nature and scope of the present invention. Furthermore, those with regard toward the relevant art will appreciate that although apparatus 10, with the exception of the liquid and sealing layers 20 and 21, includes specific structural features consistent with conventional organic EL display apparatus, other physical constitutions may be employed consistent with conventional organic EL display apparatus generally of the type herein set forth for the purposes of illustration.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

What is claimed is:

1. A method of encapsulating devices comprising the steps of:
   providing a device on a substrate;
   providing a metallic sheet having a stand-off structure depending therefrom, the stand-off structure bounding a cavity larger than the device;
   positioning the stand-off structure over the device with the positioned in the cavity; and
   sealing the metallic sheet to the substrate at a perimeter outboard of the stand-off structure to seal the device in the cavity.

2. The method of claim 1, wherein the step of providing a metallic sheet further includes the step of providing a metallic sheet including one of aluminum, copper, or an oxide of metal.

3. The method of claim 2, wherein the step of providing the metallic sheet includes providing a metallic sheet with a thickness in a range of 25.4 $\mu$m to 254 $\mu$m.

4. The method of claim 1, wherein the step of sealing the metallic sheet at the perimeter further includes the step of patterning a perimeter seal of adhesive material on one of the metallic sheet and the substrate and adhesively sealing the metallic sheet at a perimeter to bound the device in the cavity.

5. The method of claim 1, wherein the step of providing the metallic sheet includes forming perforations through the metallic sheet circumscribing the perimeter and removing excess portions of the metallic sheet by separating the metallic sheet at the perforations subsequent to the step of sealing the metallic sheet to the substrate.

6. The method of claim 5, wherein the step of forming perforations through the metallic sheet circumscribing the perimeter includes forming elongated slots along sides of the perimeter and leaving tabs of metal at corners of the perimeter to minimize an amount of metal between perforations.

7. The method of claim 5, wherein the step of providing the metallic sheet further includes providing alignment marks on the metallic sheet and using the alignment marks to index the metallic sheet during the positioning and sealing steps.

8. The method of claim 1, wherein the step of providing the metallic sheet having a stand-off structure depending therefrom includes providing the stand-off structure with an edge circumscribing the cavity and adapted to engage the substrate, and positioning adhesive material on the edge for adhesively bonding the stand-off structure to the substrate.

9. A method of encapsulating organic electroluminescent devices, comprising the steps of:

providing a substrate having an array of organic electroluminescent devices formed thereon, each organic electroluminescent device having an active organic region;

providing a metallic sheet having alignment marks and perforations therein;

mounting a plurality of stand-off structures on the metallic sheet, each of the stand-off structures having edges extending generally perpendicular to the metallic sheet and defining a cavity within the edges, and each of the cavities being designed and positioned to overlie a single associated organic electroluminescent device of the array of organic electroluminescent devices so that the active organic region of the single associated organic electroluminescent device is enclosed within the cavity;

using the alignment marks, positioning the metallic sheet relative to the substrate so that each stand-off structure of the plurality of stand-off structures overlies the single associated organic electroluminescent device of the array of organic electroluminescent devices;

sealing the metallic sheet at a perimeter outboard of each of the plurality of stand-off structures to sealingly encapsulate at least the active organic region of the single associated organic electroluminescent device in the cavity of each of the plurality of stand-off structures; and separating the metallic sheet along the perforations to remove any excess portion of the metallic sheet.

10. The method of claim 9, wherein the step of providing a metallic sheet further includes the step of providing a metallic sheet including one of aluminum, copper, or an oxide of metal.

11. The method of claim 9, wherein the step of providing the metallic sheet includes providing a metallic sheet with a thickness in a range of 25.4 $\mu$m to 254 $\mu$m.

12. The method of claim 9, wherein the step of sealing the metallic sheet at the perimeter further includes the step of patterning a perimeter seal of adhesive material on one of the metallic sheet and the substrate and adhesively sealing the metallic sheet at a perimeter to bound the organic electroluminescent device in the cavity.

13. The method of claim 9, wherein the step of mounting a stand-off structure on the metallic sheet further includes the step of patterning a hydroscopic barrier on the sheet.

14. The method of claim 9, wherein the step of sealing the metallic sheet at a perimeter further includes the step of patterning one of a polyimide barrier or a silicon barrier on the sheet at the perimeter.

15. The method of claim 9, wherein the step of forming perforations through the metallic sheet circumscribing the perimeter includes forming elongated slots along sides of the perimeter and leaving tabs of metal at corners of the perimeter to minimize an amount of metal between perforations.

16. The method of claim 15, wherein the step of forming elongated slots along sides of the perimeter and leaving tabs of metal at corners of the perimeter to minimize the amount of metal between perforations includes leaving tabs with a width in a range of 5% to 50% greater than a thickness of the metallic sheet.

17. The method of claim 9, wherein the step of mounting a plurality of stand-off structures on the metallic sheet includes providing each of the stand-off structures with an edge circumscribing the cavity and adapted to engage the substrate, and positioning adhesive material on the edge for adhesively bonding the stand-off structures to the substrate.

* * * * *